(12) United States Patent
Natsume

(10) Patent No.: US 11,479,211 B2
(45) Date of Patent: Oct. 25, 2022

(54) WIPER CONTROL DEVICE

(71) Applicant: DENSO CORPORATION, Kariya (JP)

(72) Inventor: Yohei Natsume, Kariya (JP)

(73) Assignee: DENSO CORPORATION, Kariya (JP)

( * ) Notice: Subject to any disclaimer, the term of this patent is extended or adjusted under 35 U.S.C. 154(b) by 1 day.

(21) Appl. No.: 16/976,359

(22) PCT Filed: Feb. 14, 2019

(86) PCT No.: PCT/JP2019/005333
§ 371 (c)(1),
(2) Date: Aug. 27, 2020

(87) PCT Pub. No.: WO2019/167647
PCT Pub. Date: Sep. 6, 2019

(65) Prior Publication Data
US 2021/0001812 A1    Jan. 7, 2021

(30) Foreign Application Priority Data
Feb. 28, 2018    (JP) .............................. JP2018-035508

(51) Int. Cl.
| | |
|---|---|
| *B60S 1/08* | (2006.01) |
| *H02P 7/03* | (2016.01) |
| *G01R 31/34* | (2020.01) |
| *H01M 50/569* | (2021.01) |
| *H02P 1/04* | (2006.01) |

(52) U.S. Cl.
CPC .............. *B60S 1/08* (2013.01); *G01R 31/343* (2013.01); *H02P 7/04* (2016.02); *H01M 50/569* (2021.01); *H02P 1/04* (2013.01)

(58) Field of Classification Search
CPC ............................... H01M 50/569; H02P 1/04
USPC .................................... 318/490, 400.15, 341
See application file for complete search history.

(56) References Cited

U.S. PATENT DOCUMENTS

| | | | | |
|---|---|---|---|---|
| 4,705,997 A | * | 11/1987 | Juzswik | .................... H02P 1/04 |
| | | | | 318/341 |
| 2017/0361810 A1 | * | 12/2017 | Ijima | ........................ B60S 1/08 |

FOREIGN PATENT DOCUMENTS

| | | |
|---|---|---|
| JP | 2007-330040 A | 12/2007 |
| JP | 2010-158131 A | 7/2010 |
| JP | 2017-034902 A | 2/2017 |

* cited by examiner

*Primary Examiner* — Muhammad S Islam
*Assistant Examiner* — Zemenay T Truneh
(74) *Attorney, Agent, or Firm* — Oliff PLC

(57) ABSTRACT

A voltage divider circuit is configured by a resistor having one end connected to a positive electrode of a battery configuring a power source and another end connected to a first terminal that is a motor terminal on one side of a wiper motor, and a FET having one end connected to the first terminal and another end grounded. The voltage divider circuit lowers a voltage of the battery to a test voltage that does not cause the wiper motor to rotate. A microcomputer detects a detected voltage that is a voltage output from the voltage divider circuit to a second terminal that is a motor terminal on the other side of the wiper motor via the first terminal of the wiper motor and the wiper motor, and computes a motor terminal voltage, this being a potential difference between the first terminal and the second terminal, from the detected voltage.

9 Claims, 12 Drawing Sheets

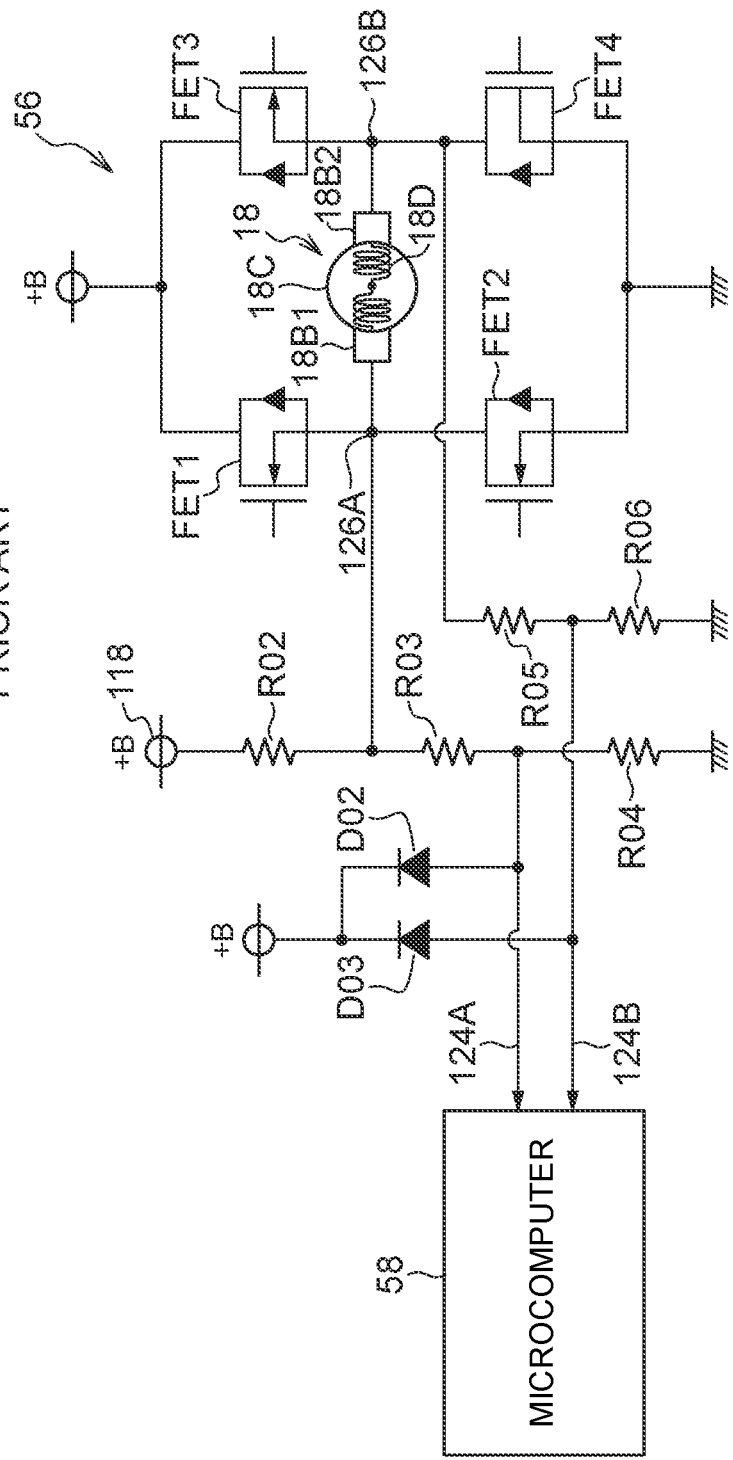

WIPER CONTROL DEVICE

TECHNICAL FIELD

The present disclosure relates to a wiper control device.

BACKGROUND ART

A wiper control device uses a controller such as a microcomputer to control a drive circuit configured by switching elements such as field effect transistors (FETs) in order to generate a voltage for application to a wiper motor that causes a wiper blade to perform a wiping operation.

In cases in which a wiper motor configuring a wiper system is, for example, configured by a brushed DC motor, potential issues that may arise include poor contact between the brush and the commutator, or circuit discontinuity in a coil of the wiper motor. Shorting may also occur in switching elements configuring a drive circuit.

The state of the wiper motor and the drive circuit are tested before shipping a wiper system product including a wiper control device. As a result of this testing, pieces that are deemed to be free of electrical connection issues inside the wiper motor, and also deemed to have normally-operating drive circuit switching elements, are shipped as products.

Such a wiper control device may be provided in advance with a test circuit such as that illustrated in FIG. 12. During pre-shipping testing, power supplied from the positive electrode (B terminal) of a vehicle battery through a terminal 118 is output from between a resistor R02 and a resistor R03 of a voltage divider circuit configured by the resistor R02 and resistors R03 and R04, and is supplied to a first terminal 126A, this being a motor terminal on one side of a wiper motor 18.

The power supplied to the first terminal 126A passes through a first brush 18B1, a commutator 18C, a coil 18D, the commutator 18C, and a second brush 18B2 of the wiper motor, and is output to a second terminal 126B, this being a motor terminal on the other side of the wiper motor 18. The power output to the second terminal 126B is then output from between a resistor R05 and a resistor R06 of a voltage divider circuit configured by the resistor R05 and the resistor R06. The power output from between the resistor R05 and the resistor R06 passes through a terminal 124B and is input to a microcomputer 58 as a signal indicating a voltage.

The power from the battery supplied through the terminal 118 is also output from between the resistor R03 and the resistor R04 of the voltage divider circuit configured by the resistor R02, R03 and the resistor R04. The power output from between the resistor R03 and the resistor R04 passes through a terminal 124A and is input to the microcomputer 58 as a signal indicating a voltage.

The microcomputer 58 computes microcomputer-detected voltages (hereafter simply referred to as detected voltages), these being respective voltages at the terminals 124A, 124B, from the signals input by the terminals 124A, 124B. The microcomputer 58 also computes a power source voltage, this being the voltage of the battery, and also computes motor terminal voltages, these being the respective voltages at the first terminal 126A and the second terminal 126B of the wiper motor 18, based on the detected voltages. The respective states of the wiper motor 18 and a drive circuit 56 are determined based on conditions of the motor terminal voltages with respect to the power source voltage.

Japanese Patent Application Laid-Open (JP-A) No. 2017-34902 (Patent Document 1) discloses an invention relating to a motor that determines whether or not breaks or shorts are present in a circuit of the motor based on motor terminal voltages.

SUMMARY OF INVENTION

Technical Problem

However, testing of the motor disclosed in Patent Document 1 requires a complex circuit such as that illustrated in FIG. 12. Diodes D02, D03 to protect the microcomputer 58 from high voltages need to be provided separately, in addition to the resistors R02 to R06 configuring the voltage divider circuits.

In consideration of the above circumstances, an object of the present disclosure is to provide a wiper control device capable of testing states of a wiper motor and a drive circuit using a simple configuration.

Solution to Problem

In order to address the above issue, a wiper control device of a first aspect includes a wiper motor that includes a first terminal and a second terminal, and that causes a wiper blade to perform a wiping operation by rotating in a specific direction in a state in which a positive voltage is supplied to the first terminal and the second terminal is grounded, and by rotating in the opposite direction to the specific direction in a state in which the first terminal is grounded and a positive voltage is supplied to the second terminal, a drive circuit that includes a first switching element with one end connected to a power source and another end connected to the first terminal, a second switching element with one end connected to the first terminal and another end grounded, a third switching element with one end connected to the power source and another end connected to the second terminal, and a fourth switching element with one end connected to the second terminal and another end grounded, the respective switching elements being switched ON/OFF so as to supply the positive voltage to the first terminal and ground the second terminal, or so as to ground the first terminal and supply the positive voltage to the second terminal, a voltage divider circuit that is configured by the second switching element and a resistor having one end connected to the power source and another end connected to the first terminal, and that is configured to lower a voltage of the power source to a test voltage that does not cause the wiper motor to rotate, a power source voltage detection section that is configured to detect the voltage of the power source, and a measurement section that is input with a detected voltage of a voltage output from the voltage divider circuit to the second terminal via the first terminal and the wiper motor in a state in which all the switching elements of the drive circuit are in an OFF state, and that is configured to compute a motor terminal voltage, this being a potential difference between the first terminal and the second terminal, from the detected voltage.

According to this wiper control device, the resistor connected to the power source and the second switching element configuring the drive circuit configure the voltage divider circuit that lowers the voltage of the power source. This enables the test voltage allowing states of the wiper motor and the drive circuit to be tested to be generated and supplied to the first terminal of the wiper motor using a simple configuration. Moreover, the motor terminal voltage, namely the potential difference between the first terminal and the second terminal of the wiper motor, is computed from the detected voltage output from the second terminal of the wiper motor when the test voltage is supplied to the first terminal of the wiper motor, thereby enabling the states of the wiper motor and the drive circuit to be tested.

A wiper control device according to a second aspect is the wiper control device according to the first aspect, wherein the measurement section determines states of the wiper motor and the drive circuit based on respective conditions of the detected voltage, the motor terminal voltage, and the power source voltage.

According to this wiper control device, states of the wiper motor and the drive circuit can be determined based on the respective conditions of the detected voltage, the motor terminal voltage, and the power source voltage when the test voltage generated using a simple configuration is supplied to the first terminal of the wiper motor.

A wiper control device according to a third aspect is the wiper control device according to the second aspect, wherein the measurement section determines that a break is present in circuitry of the wiper motor in cases in which the power source voltage is normal and the detected voltage and the motor terminal voltage each exhibit a gradually attenuating oscillating state converging on a constant low voltage.

According to this wiper control device, the presence of a break in the circuitry of the wiper motor can be determined using a simple configuration in cases in which both the detected voltage and the motor terminal voltage exhibit a gradually attenuating oscillating state converging on a constant low voltage when the test voltage is supplied to the first terminal of the wiper motor.

A wiper control device according to a fourth aspect is the wiper control device of the second aspect or the third aspect, wherein the measurement section determines that either the first switching element or the third switching element has shorted in cases in which the power source voltage is normal and the detected voltage and the motor terminal voltage each exhibit a gradually attenuating oscillating state converging on a constant high voltage.

According to this wiper control device, shorting of either the first switching element or the third switching element can be determined using a simple configuration in cases in which both the detected voltage and the motor terminal voltage exhibit a gradually attenuating oscillating state converging on a constant high voltage when the test voltage is supplied to the first terminal of the wiper motor.

A wiper control device according to a fifth aspect is the wiper control device of any one out of the second aspect to the fourth aspect, wherein the measurement section determines that either the second switching element or the fourth switching element has shorted in cases in which the power source voltage is normal and the detected voltage and the motor terminal voltage each indicate a constant low voltage without exhibiting an oscillating state.

According to this wiper control device, shorting of either the second switching element or the fourth switching element can be determined using a simple configuration in cases in which both the detected voltage and the motor terminal voltage indicate a constant low voltage without exhibiting an oscillating state when the test voltage is supplied to the first terminal of the wiper motor.

BRIEF DESCRIPTION OF DRAWINGS

FIG. 12 is a block diagram illustrating an example of a test circuit for testing operating states of a wiper motor and a drive circuit.

DESCRIPTION OF EMBODIMENTS

Figure 1:
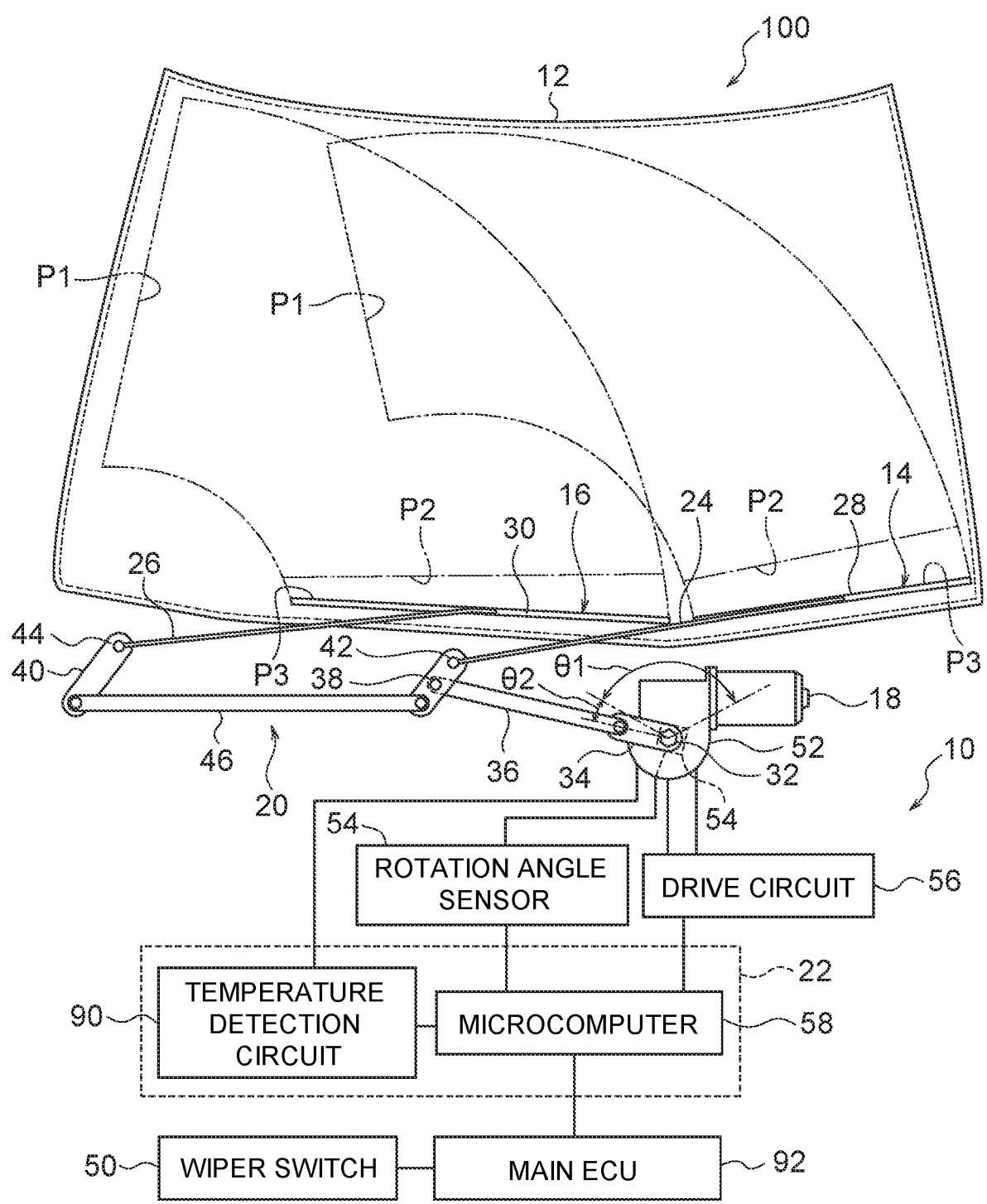
FIG. 1 is a schematic diagram illustrating a configuration of a wiper system including a wiper control device according to an exemplary embodiment of the present disclosure.

FIG. 1 is a schematic diagram illustrating a configuration of a wiper system 100 including a wiper control device 10 according to an exemplary embodiment. The wiper system 100 is, for example, a device for wiping a windshield glass 12 installed to a vehicle such as a passenger car. The wiper system 100 includes a pair of wipers 14, 16, a wiper motor 18, a link mechanism 20, and the wiper control device 10.

The wipers 14, 16 are configured by respective wiper arms 24, 26 and wiper blades 28, 30. Base end portions of the wiper arms 24, 26 are respectively fixed to pivot shafts 42, 44, described later. The wiper blades 28, 30 are respectively fixed to leading end portions of the wiper arms 24, 26.

The wiper blades 28, 30 of the wipers 14, 16 perform a to-and-fro operation over the windshield glass 12 accompanying operation of the wiper arms 24, 26, such that the wiper blades 28, 30 wipe the windshield glass 12.

The wiper motor 18 includes an output shaft 32 coupled through a speed reduction mechanism 52 configured mainly by a worm gear. The output shaft 32 is capable of rotating in forward and reverse directions. The link mechanism 20 includes a crank arm 34, a first link rod 36, a pair of pivot levers 38, 40, the pair of pivot shafts 42, 44, and a second link rod 46.

One end side of the crank arm 34 is fixed to the output shaft 32, and the other end side of the crank arm 34 is operably coupled to one end side of the first link rod 36. The other end side of the first link rod 36 is operably coupled to the pivot lever 38 at a location nearer to the other end of the pivot lever 38 than the end where the pivot shaft 42 is located. The two ends of the second link rod 46 are operably coupled to the pivot lever 38 at the other end of the pivot lever 38 to the end where the pivot shaft 42 is located, and to the pivot lever 40 at the end of the pivot lever 40 corresponding to the same end of the pivot lever 38.

The pivot shafts 42, 44 are operably supported by non-illustrated pivot holders provided on the vehicle body. The wiper arms 24, 26 are fixed, via the pivot shafts 42, 44, to the ends of the pivot levers 38, 40 where the pivot shafts 42, 44 are located.

In the wiper system 100 including the wiper control device 10 according to the present exemplary embodiment, when the output shaft 32 is rotated forward or in reverse through a rotation angle θ1 within a specific range, rotation force of the output shaft 32 is transmitted to the wiper arms 24, 26 through the link mechanism 20, and the wiper blades 28, 30 perform a to-and-fro operation over the windshield glass 12 between a lower return position P2 and an upper return position P1 accompanying the to-and-fro operation of the wiper arms 24, 26. Various values may be employed as the value of θ1 according to the configuration of the link mechanism of the wiper control device 10 and the like, and in the present exemplary embodiment θ1 is, for example, 140°.

As illustrated in FIG. 1, in the wiper system 100 including the wiper control device 10 according to the present exemplary embodiment, a configuration is adopted in which the crank arm 34 and the first link rod 36 form a straight line shape when the wiper blades 28, 30 are positioned at a stowed position P3.

The stowed position P3 is provided below the lower return position P2. The wiper blades 28, 30 are operated to the stowed position P3 by rotating the output shaft 32 by a rotation angle θ2 from a state in which the wiper blades 28, 30 are already at the lower return position P2. Various values may be employed as the value of the rotation angle θ2 according to the configuration of the link mechanism of the wiper control device 10 and the like, and in the present exemplary embodiment θ2 is, for example, 10°.

Note that in cases in which the rotation angle θ2 is "0", the lower return position P2 and the stowed position P3 are aligned with each other and the wiper blades 28, 30 are stopped and stowed at the lower return position P2.

A wiper motor control circuit 22 for controlling rotation of the wiper motor 18 is connected to the wiper motor 18. The wiper motor control circuit 22 according to the present exemplary embodiment includes a temperature detection circuit 90 to detect a temperature of a circuit board of the wiper motor 18 based on a signal output from a thermistor provided to the circuit board, and a microcomputer.

The microcomputer 58 of the wiper motor control circuit 22 controls the rotation speed of the wiper motor 18 based the detection result of a rotation angle sensor 54 for detecting the rotation speed and the rotation angle of the output shaft 32 of the wiper motor 18. The rotation angle sensor 54 is provided inside the speed reduction mechanism 52 of the wiper motor 18, and detects by converting a magnetic field (magnetic force) of a sensor magnet that rotates coupled to the output shaft 32 into a current.

Since the wiper motor 18 according to the present exemplary embodiment includes the speed reduction mechanism 52 as mentioned above, the rotation speed and rotation angle of the output shaft 32 are not the same as the rotation speed and rotation angle of a wiper motor main body. However, in the present exemplary embodiment, the wiper motor main body and the speed reduction mechanism 52 are configured as an inseparable integral body, and so hereinafter the rotation speed and rotation angle of the output shaft 32 are taken as being synonymous with the rotation speed and rotation angle of the wiper motor 18.

The microcomputer 58 is able to compute the position on the windshield glass 12 of the wiper blades 28, 30 from the rotation angle of the output shaft 32 detected by the rotation angle sensor 54, and controls the drive circuit 56 so as to change the rotation speed of the output shaft 32 according to this computed position. The drive circuit 56 is a circuit for generating a voltage for application to the wiper motor 18 under control of the wiper motor control circuit 22. The drive circuit 56 generates the voltage to be applied to the wiper motor 18 by switching power from a vehicle battery acting as a power source.

A wiper switch 50 is connected to the microcomputer 58 of the wiper motor control circuit 22 through a main electronic control unit (ECU) 92 that controls a vehicle engine and the like. The wiper switch 50 is a switch that switches the supply of power from the vehicle battery to the wiper motor 18 ON or OFF. The wiper switch 50 is capable of being switched to a low speed operation mode selection position (LOW) to operate the wiper blades 28, 30 at low speed, a high speed operation mode selection position (HIGH) to operate the wiper blades 28, 30 at high speed, an intermittent operation mode selection position (INT) to operate the wiper blades 28, 30 intermittently at a fixed cycle, an automatic operation mode selection position (AUTO) to operate the wiper blades 28, 30 when a rain sensor (not illustrated in the drawings) has detected rain droplets, and a stop mode selection position (OFF). Command signals to rotate the wiper motor 18 according to the selection positions of the respective modes are output to the microcomputer 58 through the main ECU 92. For example, the wiper motor 18 is rotated at high speed when the wiper switch 50 is in the high speed operation mode selection position, the wiper motor 18 is rotated at low speed when the wiper switch 50 is in the low speed operation mode selection position, and the wiper motor 18 is rotated intermittently when the wiper switch 50 is in the intermittent operation mode selection position.

When the signal output from the wiper switch 50 according to the selection position of the corresponding mode is input to the microcomputer 58 through the main ECU 92, the microcomputer 58 performs control according to the command signal from the wiper switch 50. Specifically, the microcomputer 58 reads the rotation signal for the output shaft 32 and controls the voltage applied to the wiper motor 18 such that the wiper blades 28, 30 are operated with the desired to-and-fro wiping cycle based on the command signal from the wiper switch 50.

Figure 2:
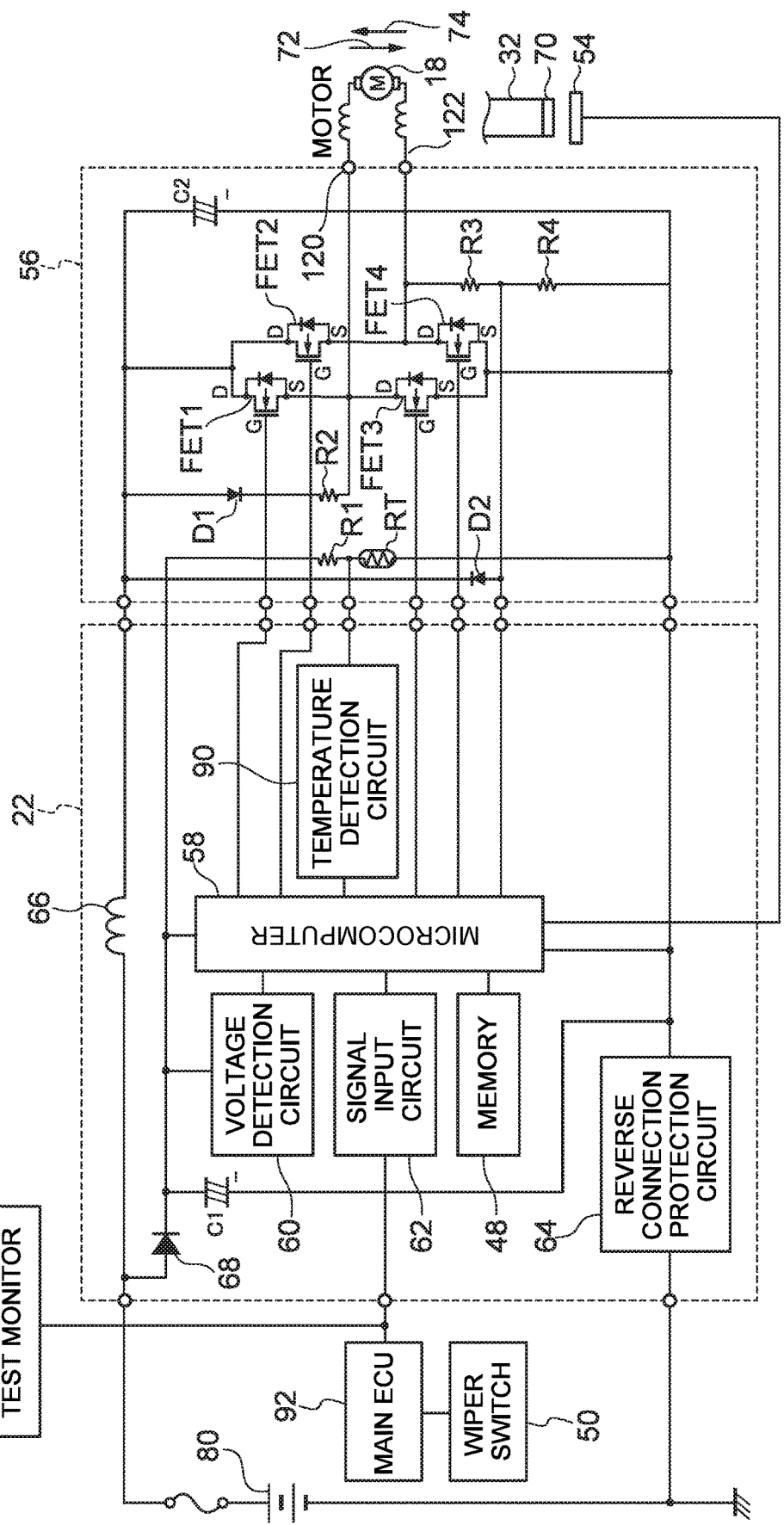
FIG. 2 is a block diagram schematically illustrating an example of a configuration of a wiper control device according to an exemplary embodiment of the present disclosure.

FIG. 2 is a block diagram schematically illustrating an example of a configuration of the wiper control device 10 according to the present exemplary embodiment. The wiper motor 18 illustrated in FIG. 2 is, for example, a brushed DC motor.

The wiper control device 10 illustrated in FIG. 2 includes the drive circuit 56 for generating a voltage for application to coil terminals of the wiper motor 18, and the wiper motor control circuit 22 including the microcomputer 58 for controlling switching elements configuring the drive circuit 56 ON or OFF. Power from a battery 80 is supplied to the microcomputer 58 through a diode 68, and in addition the voltage of the supplied power is detected by a voltage detection circuit 60 provided between the diode 68 and the microcomputer 58, with the detection result being output to the microcomputer 58. An electrolytic capacitor C1 is also provided, with one end of the electrolytic capacitor C1 connected between the diode 68 and the microcomputer 58, and the other end (−) grounded. The electrolytic capacitor C1 is a capacitor employed to stabilize the power source of the microcomputer 58. For example, the electrolytic capacitor C1 protects the microcomputer 58 by accumulating sudden high voltages such as power surges, and discharging them to ground.

Figure 4A:
FIG. 4A is a diagram illustrating an example of a test result for a power source voltage in a case in which a wiper motor and a drive circuit of a wiper control device according to an exemplary embodiment of the present disclosure are operating normally.
Figure 4B:
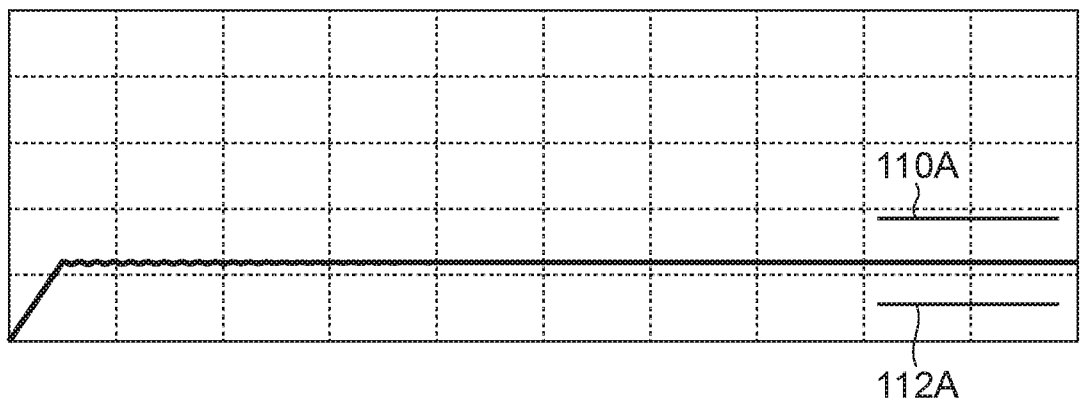
FIG. 4B is a diagram illustrating an example of a test result for a detected voltage detected by a microcomputer in a case in which a wiper motor and a drive circuit of a wiper control device according to an exemplary embodiment of the present disclosure are operating normally.
Figure 4C:
FIG. 4C is a diagram illustrating an example of a test result for a motor terminal voltage indicating a potential difference between one end and another end of a wiper motor in a case in which the wiper motor and a drive circuit of a wiper control device according to an exemplary embodiment of the present disclosure are operating normally.

A signal from the wiper switch 50 for instructing the rotation speed of the wiper motor 18 is input to the microcomputer 58 via the main ECU 92 and a signal input/output circuit 62. Since the signal output from the wiper switch 50 is an analogue signal, the signal is digitalized by the signal input/output circuit 62 before being input to the microcomputer 58. Moreover, signals indicating states of the wiper motor 18 and the drive circuit 56 are output from the microcomputer 58 to the main ECU via the signal input/output circuit 62. During pre-shipment product testing, a test monitor 98 is connected between the signal input/output circuit 62 and the main ECU. As illustrated in FIG. 4A to FIG. 4C, etc. described later, a power source voltage, detected voltages, and motor terminal voltages are displayed on a test monitor 98 during the testing.

The rotation angle sensor 54 for detecting the magnetic field of a sensor magnet 70 as it changes according to rotation of the output shaft 32 is connected to the microcomputer 58. The microcomputer 58 identifies the position of the wiper blades 28, 30 on the windshield glass 12 by computing the rotation angle of the output shaft based on the signal output by the rotation angle sensor 54.

Furthermore, the microcomputer 58 references data stored in a memory 48 regarding rotation speeds of the wiper motor 18 specified according to the positions of the wiper blades 28, 30. The microcomputer 58 then controls the drive circuit 56 such that the rotation speed of the wiper motor 18 becomes the rotation speed corresponding to the identified position of the wiper blades 28, 30.

As illustrated in FIG. 2, as switching elements, the drive circuit 56 employs a FET 1, a FET 2, a FET 3, and a FET 4, these being N-field effect transistors (FETs). The drains of the FET 1 and the FET 2 are each connected to the battery 80 through a noise prevention coil 66, and the sources of the FET 1 and the FET 2 are connected to the drains of the FET 3 and the FET 4, respectively. The sources of the FET 3 and the FET 4 are grounded.

The source of the FET 1 and the drain of the FET 3 are connected to one coil terminal of the wiper motor 18, and the source of the FET 2 and the drain of the FET 4 are connected to another coil terminal of the wiper motor 18.

The FET 1 and the FET 4 are switched ON by input of a high level signal to the gates of the FET 1 and the FET 4 to cause a CW current 72 to flow in the wiper motor 18 so as to, for example, operate the wiper blades 28, 30 in clockwise direction as viewed from inside the vehicle cabin. Furthermore, the voltage of the CW current 72 can be modulated by using Pulse Width Modulation (PWM) control to perform micro ON/OFF control of one out of the FET 1 or the FET 4 while the other thereof is being controlled ON.

The FET 2 and the FET 3 are switched ON by input of a high level signal to the gates of the FET 2 and the FET 3 to cause a CCW current 74 to flow in the wiper motor 18 so as to, for example, operate the wiper blades 28, 30 in a counterclockwise direction as viewed from inside the vehicle cabin. Furthermore, the voltage of the CCW current 74 can be modulated by using PWM control to perform micro ON/OFF control of one out of the FET 2 or the FET 3 while the other thereof is being controlled ON.

A voltage divider circuit configured by a thermistor RT for detecting temperature and a resistor R1 is mounted on a circuit board of the drive circuit 56. The thermistor RT is an element that has a resistance that changes according to temperature. When the resistance of the thermistor RT changes, the voltage divided by the voltage divider circuit configured by the thermistor RT and the resistor R1 also changes. The voltage divided by this voltage divider circuit is converted into a digital signal capable of being processed by the microcomputer 58 by the temperature detection circuit 90, and this digital signal is input to the microcomputer 58. The microcomputer 58 computes the temperature of the circuit board mounted with the drive circuit 56 from the change in the voltage divided by the voltage divider circuit configured by the thermistor RT and the resistor R1. In the present exemplary embodiment, the temperature detected by the thermistor RT is treated as a physical quantity that represents the load on the wiper motor 18.

The thermistor RT may be provided at a location other than on the circuit board mounted with the drive circuit 56, as long as it is provided at a location where the temperature changes according to the load on the wiper motor 18 and conspicuous heat generation is present. For example, the thermistor RT may be mounted inside housing for the wiper motor 18 if this is possible.

In the present exemplary embodiment, a reverse connection protection circuit 64 and the noise prevention coil 66 are provided between the drive circuit 56 and the battery 80 serving as the power source, and an electrolytic capacitor C2 is provided in parallel to the drive circuit 56. The noise prevention coil 66 is an element for suppressing noise generated by switching of the drive circuit 56.

The electrolytic capacitor C2 alleviates noise generated by the drive circuit 56, and is an element that prevents excessive current from being input to the drive circuit 56 by accumulating sudden high voltages such as surges or the like and discharging them to ground.

The reverse connection protection circuit 64 is a circuit for protecting the elements configuring the wiper control device 10 if the positive electrode and the negative electrode of the battery 80 are connected in the opposite manner to that illustrated in FIG. 2. As an example, the reverse connection protection circuit 64 is configured by what is referred to as a diode-connected FET in which the drain and the gate of the FET are connected to each other.

A test circuit configured by diodes D1, D2 and resistors R2, R3, R4 is provided to the wiper control device 10 illustrated in FIG. 2. The test circuit supplies power to a first terminal 120, this being a motor terminal on one side of the wiper motor 18, through the reverse current prevention diode D1 that has an anode connected to the positive electrode of the battery 80, and through the resistor R2 that has one end connected to the cathode of the diode D1 and its other end connected to the first terminal 120 of the wiper motor 18. The test circuit includes a voltage divider circuit configured by the resistor R3 that has one end connected to a second terminal 122, this being a motor terminal on the other side of the wiper motor 18, and the resistor R4 that has one end connected to the other end of the resistor R3 and its other end grounded. A voltage output from between the resistor R3 and the resistor R4 configuring the voltage divider circuit is input to the microcomputer 58. The first terminal 120 corresponds to the first terminal described within the scope of the claims, and the second terminal 122 corresponds to the second terminal described within the scope of the claims.

The diode D2 of the test circuit has an anode connected between the microcomputer 58 and the other end of the resistor R3 (the one end of the resistor R4) and a cathode connected to the positive electrode of the battery 80. In cases in which excessive voltage is output from the voltage divider circuit configured by the resistors R3, R4, this excessive voltage is discharged to the positive electrode side of the battery 80, thereby protecting the microcomputer 58.

Figure 3:
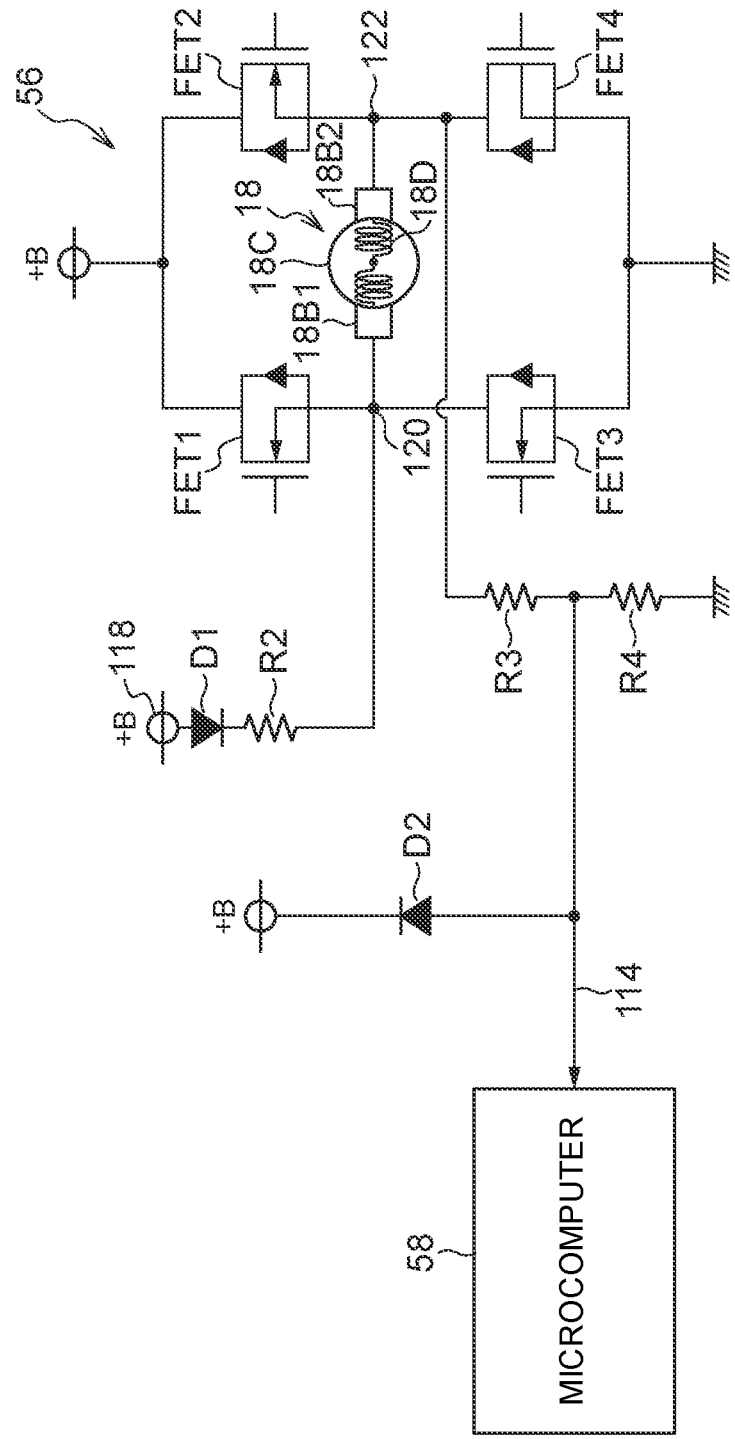
FIG. 3 is a circuit block diagram illustrating an example of a test circuit of a wiper control device according to an exemplary embodiment of the present disclosure.

FIG. 3 is a circuit block diagram illustrating an example of the test circuit of the wiper control device 10 according to the present exemplary embodiment. During pre-shipping testing, all of the FETs 1, 2, 3, 4 are switched to an OFF state, and power supplied from the positive electrode of the vehicle battery through the terminal 118 flows through the diode D1 to the resistor R2, and is supplied through the resistor R2 to the first terminal 120 that is electrically connected to a first brush 18B1 of the wiper motor 18. Although the voltage is approximately 12V at the terminal 118, the FET 2 functions as a resistor element when in the OFF state, and so the resistor R2 and the FET 2 configure a voltage divider circuit of sorts. Thus, the test voltage applied to the first terminal 120 through the resistor R2 is lower than the voltage at the terminal 118. For example, since it is sufficient to be able to identify a break or the like in the wiper motor 18 during the pre-shipping testing, there is no need to supply sufficient voltage to rotate the wiper motor 18. Instead, setting a resistor value of the resistor R2 in consideration of the resistor value of the FET 2 when in the OFF state, such that a low voltage that does not cause the wiper motor 18 to rotate is supplied through the resistor R2, enables the wiper control device 10 to be shipped with the test circuit illustrated in FIG. 3 still in situ.

If no break is present in the coil 18D of the wiper motor 18 or the like, the test voltage applied to the first terminal 120 through the resistor R2 passes through the first brush 18B1, a commutator 18C, a coil 18D, the commutator 18C, and the second brush 18B2 of the wiper motor 18, and is output through the second terminal 122. The one end of the resistor R3 is connected to the second terminal 122. The one end of the resistor R4 is connected to the other end of the resistor R3, and the other end of the resistor R4 is grounded.

The resistor R3 and the resistor R4 configure the voltage divider circuit, and the voltage output from between the resistor R3 and the resistor R4 is input to the microcomputer 58 through a terminal 114. Regardless of whether the FETs 1 to 4 are in an OFF state or an ON state, provided that the voltage output to the second terminal 122 is a sufficiently low voltage to be input to the microcomputer 58, the voltage divider circuit configured by the resistor R3 and the resistor R4 is not required.

The microcomputer 58 computes a detected voltage, this being the voltage at the terminal 114, from a signal input through the terminal 114, and also refers to the resistance value of the above-described voltage divider circuit to compute a motor terminal voltage, this being a potential difference between the first terminal 120 and the other terminal 122, from the detected voltage. The microcomputer 58 then outputs the computed detected voltage and motor terminal voltage to the test monitor 98 together with the power source voltage. The detected voltage will differ according to the specifications of the microcomputer 58, and is for example the potential difference between the terminal 114 and ground.

Although the power source voltage may be computable from the detected voltage, in the present exemplary embodiment the power source voltage is detected through the voltage detection circuit 60. The processing to compute the detected voltage, the power source voltage, and the motor terminal voltage using the signal input from the terminal 114 may alternatively be performed by the test monitor 98, this being external equipment.

FIG. 4A to FIG. 4C illustrate examples of test results in a case in which the wiper motor 18 and the drive circuit 56 of the wiper control device 10 according to the present exemplary embodiment are operating normally. FIG. 4A illustrates the power source voltage, FIG. 4B illustrates the detected voltage at the terminal 114 as detected by the microcomputer 58, and FIG. 4C illustrates the motor terminal voltage indicating the potential difference between the first terminal 120 and the other terminal 122. When the power source voltage is normal as illustrated in FIG. 4A, and the detected voltage is between an upper limit value 110A and a lower limit value 112A as illustrated in FIG. 4B, the motor terminal voltage is a constant value as illustrated in FIG. 4C.

Figure 5A:
FIG. 5A is a diagram illustrating an example of a test result for a power source voltage in a case in which a wiper motor and a drive circuit of a wiper control device including the test circuit illustrated in FIG. 12 are operating normally.
Figure 5B:
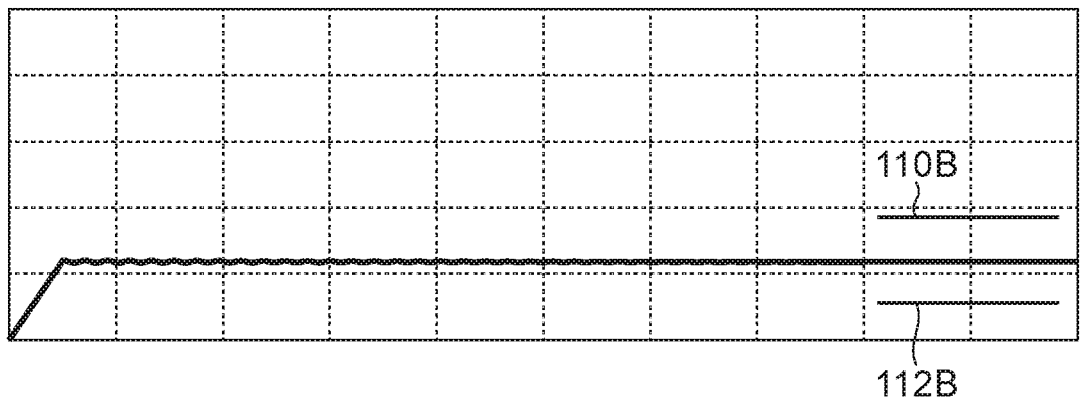
FIG. 5B is a diagram illustrating an example of a test result for a detected voltage detected by a microcomputer in a case in which a wiper motor and a drive circuit of a wiper control device including the test circuit illustrated in FIG. 12 are operating normally.
Figure 5C:
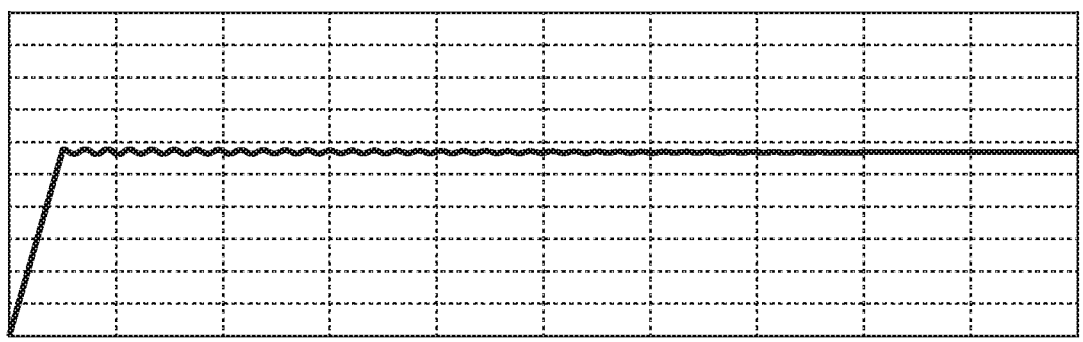
FIG. 5C is a diagram illustrating an example of a test result for a motor terminal voltage indicating a potential difference between one end and another end of a wiper motor in a case in which the wiper motor and a drive circuit of a wiper control device including the test circuit illustrated in FIG. 12 are operating normally.

FIG. 5A to FIG. 5C illustrate examples of test results in a case in which the wiper motor 18 and the drive circuit 56 of the wiper control device including the test circuit illustrated in FIG. 12 are operating normally. FIG. 5A illustrates the power source voltage, FIG. 5B illustrates the detected voltage indicating the potential difference between the terminal 124A and the terminal 124B as detected by the microcomputer 58, and FIG. 5C illustrates the motor terminal voltage indicating the potential difference between the first terminal 126A and the second terminal 126B of the wiper motor 18. When the power source voltage is normal as illustrated in FIG. 5A, and the detected voltage is between an upper limit value 110B and a lower limit value 112B as illustrated in FIG. 5B, the motor terminal voltage is a constant value as illustrated in FIG. 5C.

Figure 6A:
FIG. 6A is a diagram illustrating an example of a test result for a power source voltage in a case of an open motor circuit, namely a case in which a break is present in a circuit of a wiper motor, in a wiper control device according to an exemplary embodiment of the present disclosure.
Figure 6B:
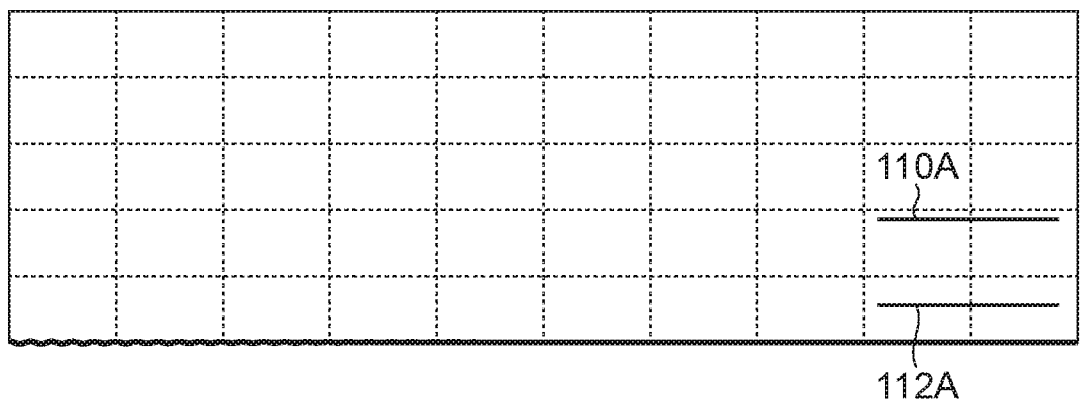
FIG. 6B is a diagram illustrating an example of a test result for a detected voltage detected by a microcomputer in a case of an open motor circuit, namely a case in which a break is present in a circuit of a wiper motor, in a wiper control device according to an exemplary embodiment of the present disclosure.
Figure 6C:
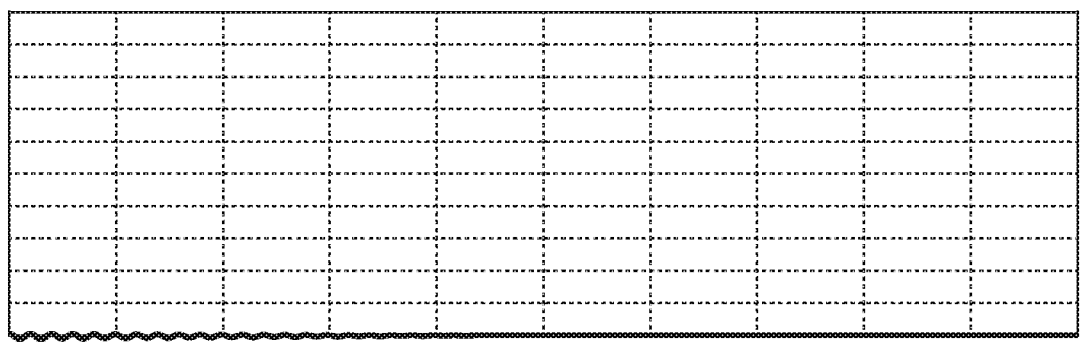
FIG. 6C is a diagram illustrating an example of a test result for a motor terminal voltage indicating a potential difference between one end and another end of a wiper motor in a case of an open motor circuit, namely a case in which a break is present in a circuit of a wiper motor, in a wiper control device according to an exemplary embodiment of the present disclosure.

FIG. 6A to FIG. 6C illustrate examples of test results in a case in which a break is present in the circuitry of the wiper motor 18 of the wiper control device 10 according to the present exemplary embodiment, namely when there is what is referred to as an open motor circuit. FIG. 6A illustrates the power source voltage, FIG. 6B illustrates the detected voltage at the terminal 114 as detected by the microcomputer 58, and FIG. 6C illustrates the motor terminal voltage indicating the potential difference between the first terminal 120 and the other terminal 122. When an open motor circuit is present, even if the power source voltage is normal as illustrated in FIG. 6A, the detected voltage exhibits a gradually attenuating oscillating state converging on a constant low voltage (approximately 0V) that is less than the lower limit value 112A as illustrated in FIG. 6B, and the motor terminal voltage exhibits a gradually attenuating oscillating state converging on a constant low voltage (approximately 0V) as illustrated in FIG. 6C. An open motor circuit is a state in which the electrical connection to the second terminal 122 is broken at any one out of the first brush 18B1, the commutator 18C, the coil 18D, the commutator 18C, or the second brush 18B2. Thus, conceivable causes of the observed phenomenon illustrated in FIG. 6 include discontinuity between the first terminal 120 and the first brush 18B1, poor contact between the first brush 18B1 and the commutator 18C, discontinuity between the commutator 18C and the coil 18D, discontinuity in the coil 18D, poor contact between the commutator 18C and the second brush 18B2, discontinuity between the second brush 18B2 and the second terminal 122, or the like.

Figure 7A:
FIG. 7A is a diagram illustrating an example of a test result for a power source voltage in a case of an open motor circuit, namely a case in which a break is present in a circuit of a wiper motor, in a wiper control device including the test circuit illustrated in FIG. 12.
Figure 7B:
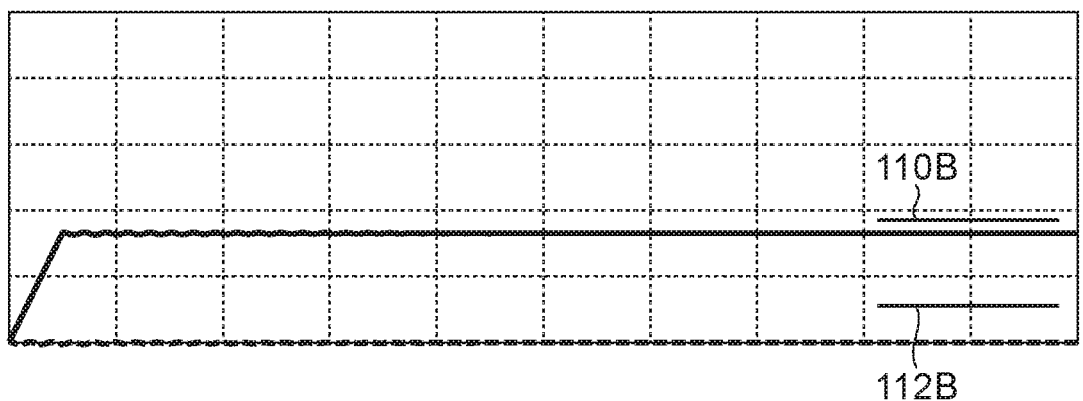
FIG. 7B is a diagram illustrating an example of a test result for detected voltages detected by a microcomputer in a case of an open motor circuit, namely a case in which a break is present in a circuit of a wiper motor, in a wiper control device including the test circuit illustrated in FIG. 12.
Figure 7C:
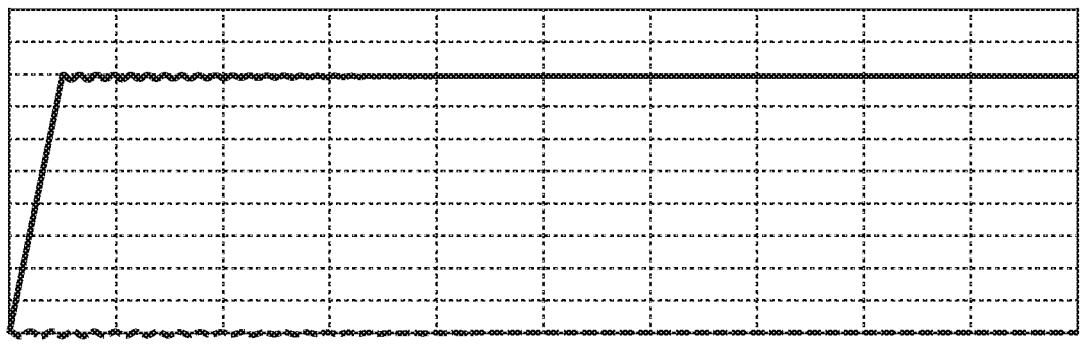
FIG. 7C is a diagram illustrating an example of a test result for motor terminal voltages, namely voltages at one end and another end of a wiper motor, when an open motor circuit is present, namely when a break is present in a circuit of a wiper motor in a wiper control device including the test circuit illustrated in FIG. 12.

FIG. 7A to FIG. 7C illustrate examples of test results in a case in which an open motor circuit has arisen, namely a case in which a break is present in the circuitry of the wiper motor 18 of the wiper control device including the test circuit illustrated in FIG. 12. FIG. 7A illustrates the power source voltage, FIG. 7B illustrates detected voltages, namely the voltage at the terminal 124A and the voltage at the terminal 124B as detected by the microcomputer 58, and FIG. 7C illustrates motor terminal voltages, namely the voltage of the first terminal 126A and the voltage of the second terminal 126B of the wiper motor 18. When an open motor circuit is present, even if the power source voltage is normal as illustrated in FIG. 7A, the detected voltage detected for the terminal 124A exhibits a gradually attenuating oscillating state close to the upper limit value 110B, while the detected voltage detected for the terminal 124B exhibits a gradually attenuating oscillating state at approximately 0V as illustrated in FIG. 7B. The motor terminal voltage of the first terminal 126A exhibits a gradually attenuating oscillating state indicating a high voltage, and the motor terminal voltage of the second terminal 126B exhibits a gradually attenuating oscillating state indicating approximately 0V as illustrated in FIG. 7C.

Figure 8A:
FIG. 8A is a diagram illustrating an example of a test result for a power source voltage in a case in which a FET configuring a drive circuit of a wiper control device according to an exemplary embodiment of the present disclosure has shorted.
Figure 8B:
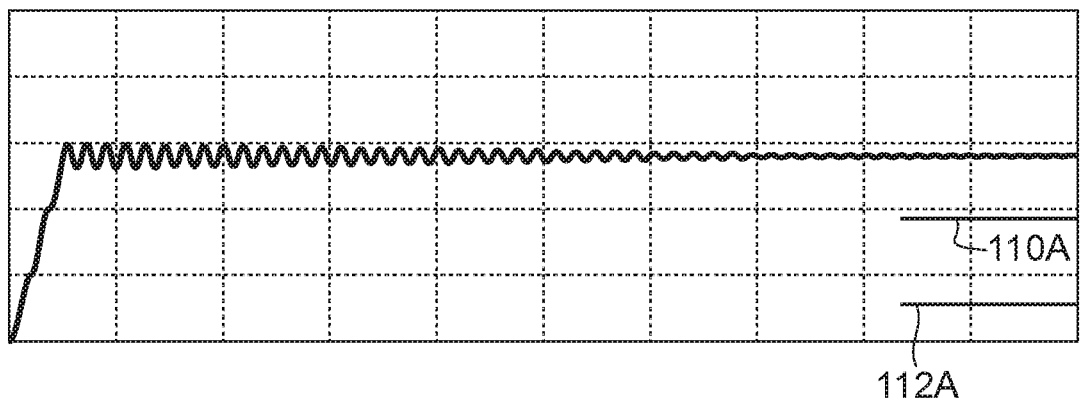
FIG. 8B is a diagram illustrating an example of a test result for a detected voltage detected by a microcomputer in a case in which a FET configuring a drive circuit of a wiper control device according to an exemplary embodiment of the present disclosure has shorted.
Figure 8C:
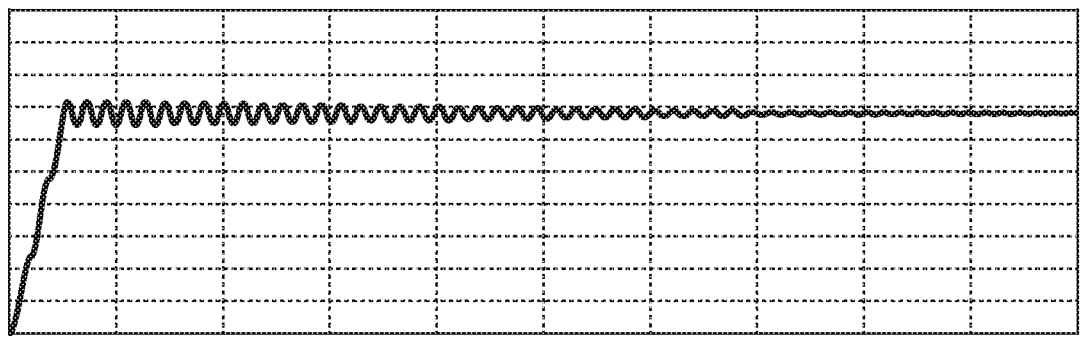
FIG. 8C is a diagram illustrating an example of a test result for a motor terminal voltage indicating a potential difference between one end and another end of a wiper motor in a case in which a FET configuring a drive circuit of a wiper control device according to an exemplary embodiment of the present disclosure has shorted.

FIG. 8A to FIG. 8C illustrate examples of test results in a case in which either the FET 1 or the FET 3 configuring the drive circuit 56 of the wiper control device 10 according to the present exemplary embodiment has shorted. FIG. 8A illustrates the power source voltage, FIG. 8B illustrates the detected voltage at the terminal 114 as detected by the microcomputer 58, and FIG. 8C illustrates the motor terminal voltage indicating the potential difference between the first terminal 120 and the other terminal 122. In cases in which either the FET 1 or the FET 3 has shorted, even if the power source voltage is normal as illustrated in FIG. 8A, the detected voltage exhibits a gradually attenuating oscillating state converging on a constant high voltage at or above the upper limit value 110A as illustrated in FIG. 8B, and the motor terminal voltage exhibits a gradually attenuating oscillating state converging on a constant high voltage as illustrated in FIG. 8C.

Figure 9A:
FIG. 9A is a diagram illustrating an example of a test result for a power source voltage in a case in which a FET configuring a drive circuit of a wiper control device including the test circuit illustrated in FIG. 12 has shorted.
Figure 9B:
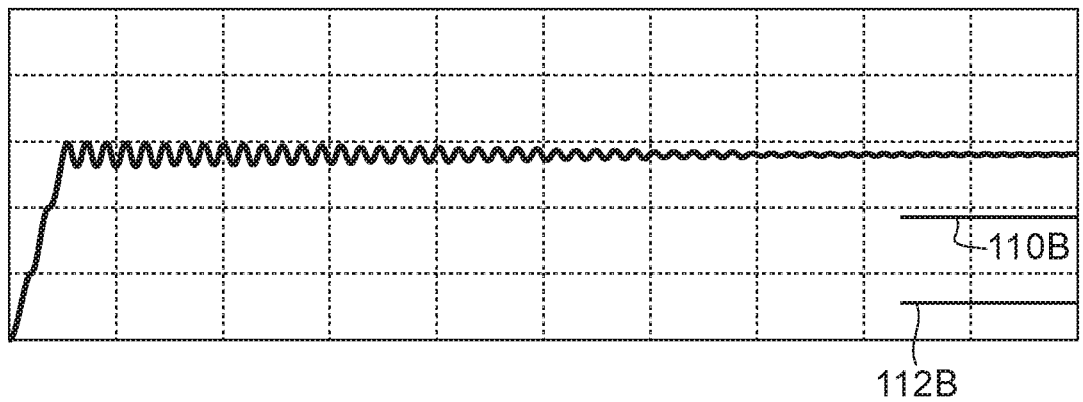
FIG. 9B is a diagram illustrating an example of a test result for a detected voltage detected by a microcomputer in a case in which a FET configuring a drive circuit of a wiper control device including the test circuit illustrated in FIG. 12 has shorted.
Figure 9C:
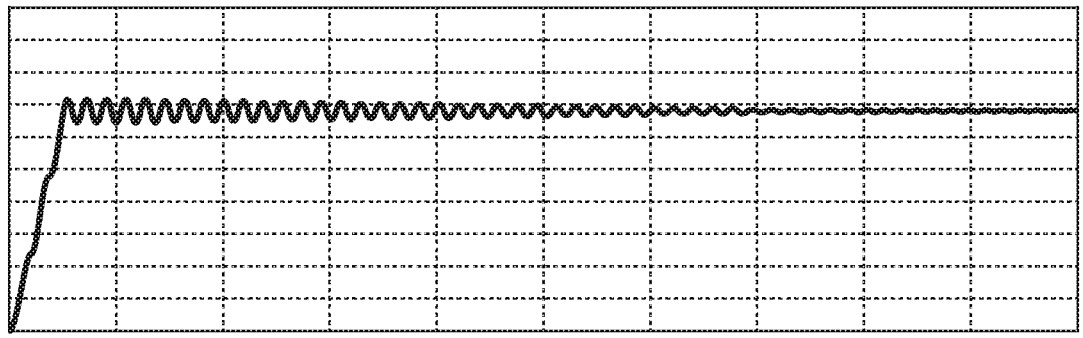
FIG. 9C is a diagram illustrating an example of a test result for a motor terminal voltage indicating a potential difference between one end and another end of a wiper motor in a case in which a FET configuring a drive circuit of a wiper control device including the test circuit illustrated in FIG. 12 has shorted.

FIG. 9A to FIG. 9C illustrate examples of test results in a case in which either the FET 1 or the FET 3 configuring the drive circuit 56 of the wiper control device including the test circuit illustrated in FIG. 12 has shorted. FIG. 9A illustrates the power source voltage, FIG. 9B illustrates the detected voltage indicating the potential difference between the terminal 124A and the terminal 124B as detected by the microcomputer 58, and FIG. 9C illustrates the motor terminal voltage indicating the potential difference between the first terminal 126A and the second terminal 126B of the wiper motor 18. In cases in which either the FET 1 or the FET 3 has shorted, even if the power source voltage is normal as illustrated in FIG. 9A, the detected voltage exhibits a gradually attenuating oscillating state converging on a constant high voltage at or above the upper limit value 110B as illustrated in FIG. 9B, and the motor terminal voltage exhibits a gradually attenuating oscillating state converging on a constant high voltage as illustrated in FIG. 9C.

Figure 10A:
FIG. 10A is a diagram illustrating an example of a test result for a power source voltage in a case in which a FET configuring a drive circuit of a wiper control device according to an exemplary embodiment of the present disclosure has shorted.
Figure 10B:
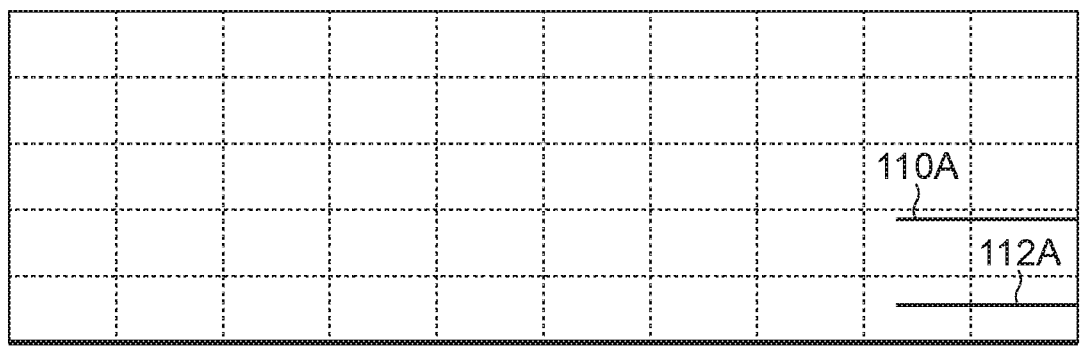
FIG. 10B is a diagram illustrating an example of a test result for a detected voltage detected by a microcomputer in a case in which a FET configuring a drive circuit of a wiper control device according to an exemplary embodiment of the present disclosure has shorted.
Figure 10C:
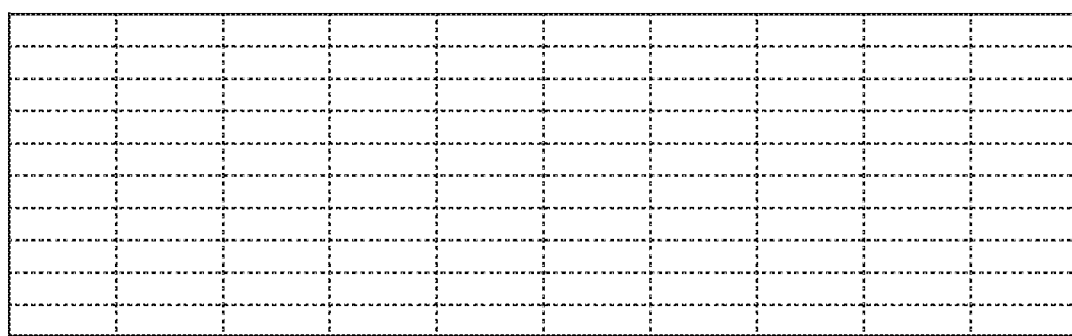
FIG. 10C is a diagram illustrating an example of a test result for a motor terminal voltage indicating a potential difference between one end and another end of a wiper motor in a case in which a FET configuring a drive circuit of a wiper control device according to an exemplary embodiment of the present disclosure has shorted.

FIG. 10A to FIG. 10C illustrate examples of test results in a case in which either the FET 2 or the FET 4 configuring the drive circuit 56 of the wiper control device 10 according to the present exemplary embodiment has shorted. FIG. 10A illustrates the power source voltage, FIG. 10B illustrates the detected voltage at the terminal 114 as detected by the microcomputer 58, and FIG. 10C illustrates the motor terminal voltage indicating the potential difference between the first terminal 120 and the other terminal 122. In cases in which either the FET 2 or the FET 4 has shorted, even if the power source voltage is normal as illustrated in FIG. 10A, the detected voltage becomes a constant low voltage (approximately 0V) without exhibiting an oscillating state as illustrated in FIG. 10B, and the motor terminal voltage becomes a constant low voltage (approximately 0V) without exhibiting an oscillating state as illustrated in FIG. 10C.

Figure 11A:
FIG. 11A is a diagram illustrating an example of a test result for a power source voltage in a case in which a FET configuring a drive circuit of a wiper control device including the test circuit illustrated in FIG. 12 has shorted.
Figure 11B:
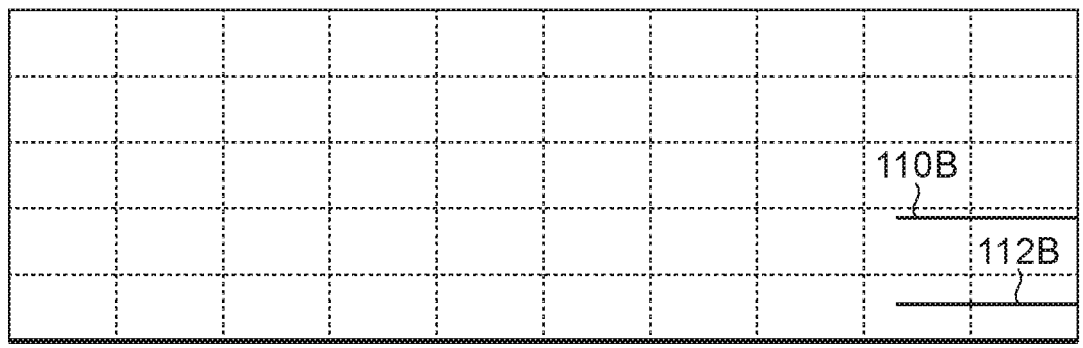
FIG. 11B is a diagram illustrating an example of a test result for a detected voltage indicating a potential difference detected by a microcomputer 58 in a case in which a FET configuring a drive circuit of a wiper control device including the test circuit illustrated in FIG. 12 has shorted.
Figure 11C:
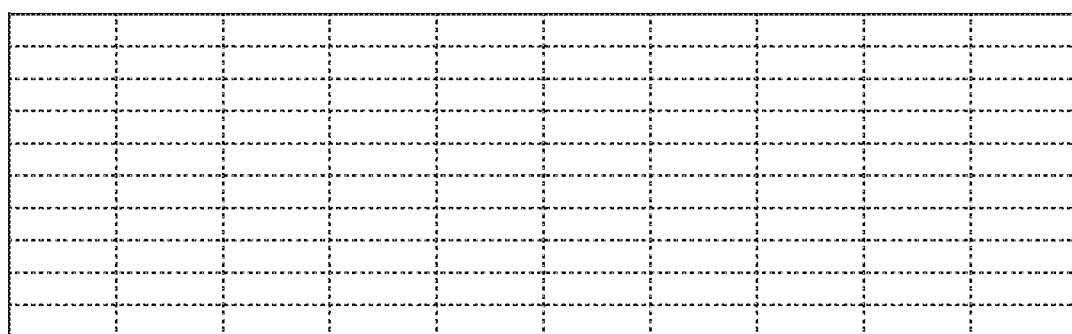
FIG. 11C is a diagram illustrating an example of a test result for a motor terminal voltage indicating a potential difference between one end and another end of a wiper motor in a case in which a FET configuring a drive circuit of a wiper control device including the test circuit illustrated in FIG. 12 has shorted.

FIG. 11A to FIG. 11C illustrate examples of test results in a case in which either the FET 2 or the FET 4 configuring the drive circuit 56 of the wiper control device including the test circuit illustrated in FIG. 12 has shorted. FIG. 11A illustrates the power source voltage, FIG. 11B illustrates the detected voltage indicating the potential difference between the terminal 124A and the terminal 124B as detected by the microcomputer 58, and FIG. 11C illustrates the motor terminal voltage indicating the potential difference between the first terminal 126A and the second terminal 126B of the wiper motor 18. In cases in which either the FET 2 or the FET 4 has shorted, even if the power source voltage is normal as illustrated in FIG. 11A, the detected voltage becomes approximately 0V as illustrated in FIG. 11B, and the motor terminal voltage becomes approximately 0V as illustrated in FIG. 11C.

In the present exemplary embodiment, the power source voltage, the detected voltage, and the motor terminal voltage respectively illustrated in FIG. 4, FIG. 6, FIG. 8, and FIG. 10 are displayed on the test monitor 98. Moreover, the microcomputer 58 may also determine the states of the wiper motor 18 and of the FETs 1 to 4 configuring the drive circuit based on the respective conditions of the power source voltage, the detected voltage, and the motor terminal voltage illustrated in FIG. 4, FIG. 6, FIG. 8, and FIG. 10, and display this determination result on the test monitor 98.

As illustrated in FIG. 4 to FIG. 11, the wiper control device 10 according to the present exemplary embodiment that includes the simplified test circuit achieves substantially the same test results in practice as those for a wiper control device including the test circuit illustrated in FIG. 12.

The present exemplary embodiment thus enables the provision of a wiper control device that is capable of testing the states of the wiper motor and drive circuit using a simple configuration in which a first switching element configuring the drive circuit 56 is made to function as a voltage divider circuit that generates a low voltage to serve as a test voltage.

The entire content of the disclosure of Japanese Patent Application No. 2018-035508 is incorporated by reference in the present specification.

All cited documents, patent applications, and technical standards mentioned in the present specification are incorporated by reference in the present specification to the same extent as if each individual cited document, patent application, or technical standard was specifically and individually indicated to be incorporated by reference.

The invention claimed is:

1. A wiper control device comprising:
a wiper motor that includes a first terminal and a second terminal, and that causes a wiper blade to perform a wiping operation by rotating in a specific direction in a state in which a positive voltage is supplied to the first terminal and the second terminal is grounded, and by rotating in the opposite direction to the specific direction in a state in which the first terminal is grounded and a positive voltage is supplied to the second terminal;
a drive circuit that includes a first switching element with one end connected to a power source and another end connected to the first terminal, a second switching element with one end connected to the first terminal and another end grounded, a third switching element with one end connected to the power source and another end connected to the second terminal, and a fourth switching element with one end connected to the second terminal and another end grounded, the respective switching elements being switched ON/OFF so as to supply the positive voltage to the first terminal and ground the second terminal, or so as to ground the first terminal and supply the positive voltage to the second terminal;
a voltage divider circuit that is configured by the second switching element and a resistor having one end connected to the power source and another end connected to the first terminal, and that is configured to lower a voltage of the power source to a test voltage that does not cause the wiper motor to rotate;
a power source voltage detection section that is configured to detect the voltage of the power source; and
a measurement section that is input with a detected voltage of a voltage output from the voltage divider circuit to the second terminal via the first terminal and the wiper motor in a state in which all the switching elements of the drive circuit are in an OFF state, and that is configured to compute a motor terminal voltage, this being a potential difference between the first terminal and the second terminal, from the detected voltage, wherein the measurement section determines states of the wiper motor and the drive circuit based on respective conditions of the detected voltage, the motor terminal voltage, and the power source voltage, and wherein the measurement section determines that a break is present in circuitry of the wiper motor in cases in which the power source voltage is normal and the detected voltage and the motor terminal voltage each exhibit a gradually attenuating oscillating state converging on a constant low voltage.

2. The wiper control device of claim 1, wherein the measurement section determines that either the first switching element or the third switching element has shorted in cases in which the power source voltage is normal and the detected voltage and the motor terminal voltage each exhibit a gradually attenuating oscillating state converging on a constant high voltage.

3. The wiper control device of claim 2, wherein the measurement section determines that either the second switching element or the fourth switching element has shorted in cases in which the power source voltage is normal and the detected voltage and the motor terminal voltage each indicate a constant low voltage without exhibiting an oscillating state.

4. The wiper control device of claim 1, wherein the measurement section determines that either the second switching element or the fourth switching element has shorted in cases in which the power source voltage is normal and the detected voltage and the motor terminal voltage each indicate a constant low voltage without exhibiting an oscillating state.

5. The wiper control device of claim 1, wherein the detected voltage is input to the measurement section by way of a third terminal connected to the second terminal.

6. A wiper control device comprising:
a wiper motor that includes a first terminal and a second terminal, and that causes a wiper blade to perform a wiping operation by rotating in a specific direction in a state in which a positive voltage is supplied to the first terminal and the second terminal is grounded, and by rotating in the opposite direction to the specific direction in a state in which the first terminal is grounded and a positive voltage is supplied to the second terminal;
a drive circuit that includes a first switching element with one end connected to a power source and another end connected to the first terminal, a second switching element with one end connected to the first terminal and another end grounded, a third switching element with one end connected to the power source and another end connected to the second terminal, and a fourth switching element with one end connected to the second terminal and another end grounded, the respective switching elements being switched ON/OFF so as to supply the positive voltage to the first terminal and ground the second terminal, or so as to ground the first terminal and supply the positive voltage to the second terminal;
a voltage divider circuit that is configured by the second switching element and a resistor having one end connected to the power source and another end connected to the first terminal, and that is configured to lower a voltage of the power source to a test voltage that does not cause the wiper motor to rotate;
a power source voltage detection section that is configured to detect the voltage of the power source; and
a measurement section that is input with a detected voltage of a voltage output from the voltage divider circuit to the second terminal via the first terminal and the wiper motor in a state in which all the switching elements of the drive circuit are in an OFF state, and that is configured to compute a motor terminal voltage, this being a potential difference between the first terminal and the second terminal, from the detected voltage, wherein the measurement section determines states of the wiper motor and the drive circuit based on respective conditions of the detected voltage, the motor terminal voltage, and the power source voltage, and wherein the measurement section determines that either the first switching element or the third switching element has shorted in cases in which the power source voltage is normal and the detected voltage and the motor terminal voltage each exhibit a gradually attenuating oscillating state converging on a constant high voltage.

7. The wiper control device of claim 6, wherein the measurement section determines that either the second switching element or the fourth switching element has shorted in cases in which the power source voltage is normal and the detected voltage and the motor terminal voltage each indicate a constant low voltage without exhibiting an oscillating state.

8. A wiper control device comprising:
a wiper motor that includes a first terminal and a second terminal, and that causes a wiper blade to perform a wiping operation by rotating in a specific direction in a state in which a positive voltage is supplied to the first terminal and the second terminal is grounded, and by rotating in the opposite direction to the specific direction in a state in which the first terminal is grounded and a positive voltage is supplied to the second terminal;
a drive circuit that includes a first switching element with one end connected to a power source and another end connected to the first terminal, a second switching element with one end connected to the first terminal and another end grounded, a third switching element with one end connected to the power source and another end connected to the second terminal, and a fourth switching element with one end connected to the second terminal and another end grounded, the respective switching elements being switched ON/OFF so as to supply the positive voltage to the first terminal and ground the second terminal, or so as to ground the first terminal and supply the positive voltage to the second terminal;
a voltage divider circuit that is configured by the second switching element and a resistor having one end connected to the power source and another end connected to the first terminal, and that is configured to lower a voltage of the power source to a test voltage that does not cause the wiper motor to rotate;
a power source voltage detection section that is configured to detect the voltage of the power source; and
a measurement section that is input with a detected voltage of a voltage output from the voltage divider circuit to the second terminal via the first terminal and the wiper motor in a state in which all the switching elements of the drive circuit are in an OFF state, and that is configured to compute a motor terminal voltage, this being a potential difference between the first terminal and the second terminal, from the detected voltage, wherein the measurement section determines states of the wiper motor and the drive circuit based on respective conditions of the detected voltage, the motor terminal voltage, and the power source voltage, and wherein the measurement section determines that either the second switching element or the fourth switching element has shorted in cases in which the power source voltage is normal and the detected voltage and the motor terminal voltage each indicate a constant low voltage without exhibiting an oscillating state.

9. A wiper control device comprising:

a wiper motor that includes a first terminal and a second terminal, and that causes a wiper blade to perform a wiping operation by rotating in a specific direction in a state in which a positive voltage is supplied to the first terminal and the second terminal is grounded, and by rotating in the opposite direction to the specific direction in a state in which the first terminal is grounded and a positive voltage is supplied to the second terminal;

a drive circuit that includes a first switching element with one end connected to a power source and another end connected to the first terminal, a second switching element with one end connected to the first terminal and another end grounded, a third switching element with one end connected to the power source and another end connected to the second terminal, and a fourth switching element with one end connected to the second terminal and another end grounded, the respective switching elements being switched ON/OFF so as to supply the positive voltage to the first terminal and ground the second terminal, or so as to ground the first terminal and supply the positive voltage to the second terminal;

a voltage divider circuit that is configured by the second switching element and a resistor having one end connected to the power source and another end connected to the first terminal, and that is configured to lower a voltage of the power source to a test voltage that does not cause the wiper motor to rotate;

a power source voltage detection section that is configured to detect the voltage of the power source; and a measurement section that is input with a detected voltage of a voltage output from the voltage divider circuit to the second terminal via the first terminal and the wiper motor in a state in which all the switching elements of the drive circuit are in an OFF state, and that is configured to compute a motor terminal voltage, this being a potential difference between the first terminal and the second terminal, from the detected voltage, wherein:

the detected voltage is input to the measurement section by way of a third terminal connected to the second terminal;

the resistor of the voltage divider circuit is a first resistor;

the wiper control device further comprises a second resistor and a third resistor;

one end of the second resistor is connected to the second terminal;

another end of the second resistor is connected to one end of the third resistor;

another end of the third resistor is grounded; and the detected voltage, which is input to the measurement section by way of the third terminal, is output from between the second and third resistors.

* * * * *